United States Patent
Tran et al.

(10) Patent No.: US 9,646,700 B2
(45) Date of Patent: *May 9, 2017

(54) NON-VOLATILE MEMORY DEVICE AND A METHOD OF PROGRAMMING SUCH DEVICE

(71) Applicant: Silicon Storage Technology, Inc., San Jose, CA (US)

(72) Inventors: Hieu Van Tran, San Jose, CA (US); Hung Quoc Nguyen, Fremont, CA (US); Anh Ly, San Jose, CA (US); Thuan Vu, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/449,926

(22) Filed: Aug. 1, 2014

(65) Prior Publication Data

US 2015/0003166 A1 Jan. 1, 2015

Related U.S. Application Data

(63) Continuation of application No. 13/315,213, filed on Dec. 8, 2011, now Pat. No. 8,804,429.

(51) Int. Cl.
*G11C 16/10* (2006.01)
*H01L 27/11517* (2017.01)
(Continued)

(52) U.S. Cl.
CPC .......... *G11C 16/10* (2013.01); *G11C 7/00* (2013.01); *G11C 16/26* (2013.01); *G11C 16/28* (2013.01);
(Continued)

(58) Field of Classification Search
None
See application file for complete search history.

(56) References Cited

U.S. PATENT DOCUMENTS

| 5,280,447 A | * | 1/1994 | Hazen | G11C 5/025 365/185.02 |
| 5,867,425 A | * | 2/1999 | Wong | G11C 16/0425 257/E27.103 |

(Continued)

FOREIGN PATENT DOCUMENTS

| JP | 62-071096 | 4/1987 |
| JP | 07-334991 | 12/1995 |

(Continued)

OTHER PUBLICATIONS

Japanese Office Action dated Mar. 4, 2015 corresponding to the related Japanese Patent Application No. 2014-545913. (Japanese and English translations).

(Continued)

*Primary Examiner* — James G Norman
(74) *Attorney, Agent, or Firm* — DLA Piper LLP (US)

(57) ABSTRACT

A non-volatile memory device has a charge pump for providing a programming current and an array of non-volatile memory cells. Each memory cell of the array is programmed by the programming current from the charge pump. The array of non-volatile memory cells is partitioned into a plurality of units, with each unit comprising a plurality of memory cells. An indicator memory cell is associated with each unit of non-volatile memory cells. A programming circuit programs the memory cells of each unit using the programming current, when fifty percent or less of the memory cells of each unit is to be programmed, and programs the inverse of the memory cells of each unit and the indicator memory cell associated with each unit, using the (Continued)

programming current, when more than fifty percent of the memory cells of each unit is to be programmed.

11 Claims, 10 Drawing Sheets

(51) Int. Cl.
    *G11C 16/26*     (2006.01)
    *G11C 7/00*     (2006.01)
    *G11C 16/28*     (2006.01)
    *G11C 7/22*     (2006.01)

(52) U.S. Cl.
    CPC .......... *H01L 27/11517* (2013.01); *G11C 7/22* (2013.01); *G11C 2207/2263* (2013.01); *G11C 2211/5647* (2013.01)

(56) References Cited

U.S. PATENT DOCUMENTS

| | | | |
|---|---|---|---|
| 6,292,868 B1 * | 9/2001 | Norman | G11C 16/26 365/202 |
| 6,438,032 B1 | 8/2002 | Pekny et al. | |
| 2004/0013026 A1 | 1/2004 | Ryoo | |
| 2005/0078519 A1 * | 4/2005 | Shiga | G11C 16/3454 365/185.17 |
| 2005/0180213 A1 * | 8/2005 | Abe | G11C 11/5621 365/185.17 |
| 2006/0259847 A1 | 11/2006 | Villa | |
| 2007/0180184 A1 | 8/2007 | Sakashita et al. | |
| 2007/0201295 A1 | 8/2007 | Lines | |
| 2008/0232163 A1 | 9/2008 | Dover | |
| 2009/0108328 A1 | 4/2009 | Widjaja | |
| 2010/0135081 A1 * | 6/2010 | Kawamura | G11C 11/5628 365/185.18 |
| 2010/0302856 A1 | 12/2010 | Ahn | |

FOREIGN PATENT DOCUMENTS

| | | |
|---|---|---|
| JP | 2004-046974 | 2/2004 |
| JP | 2004-055107 | 2/2004 |
| JP | 2009-44164 A | 2/2009 |
| JP | 2009-509287 A | 3/2009 |
| JP | 2010-129154 A | 6/2010 |
| KR | 10-2009-0014967 | 2/2009 |
| KR | 10-2010-0129179 | 12/2010 |
| TW | 200849105 A | 12/2008 |
| TW | 200849255 A | 12/2008 |
| WO | 98/47182 | 10/1998 |
| WO | 2007/069295 | 6/2007 |

OTHER PUBLICATIONS

Korean Office Action dated Jan. 14, 2015 corresponding to the related Korean Patent Application No. 10-2014-7018843. (Korean and English translations).

Taiwanese Office Action dated Mar. 8, 2015 corresponding to the related Taiwanese Patent Application No. 101143445. (Search Report in English language and Office Action in Taiwanese language.).

PCT Search Report and Written Opinion dated Mar. 26, 2013 corresponding to the related PCT Patent Application No. US12/064881.

European Search Report dated Jul. 1, 2015 corresponding to the related European Patent Application No. 12855763.4.

* cited by examiner

NON-VOLATILE MEMORY DEVICE AND A METHOD OF PROGRAMMING SUCH DEVICE

CROSS REFERENCE TO RELATED APPLICATION

This patent application is a continuation of U.S. patent application Ser. No. 13/315,213, filed on Dec. 8, 2011 and titled "A Non-Volatile Memory Device and a Method of Programming Such Device," now U.S. Pat. No. 8,804,429 issued on Aug. 12, 2014, which is incorporated herein by reference in its entirety.

TECHNICAL FIELD

The present invention relates to a non-volatile memory device and a method of programming such a non-volatile memory device.

BACKGROUND OF THE INVENTION

Non-volatile memory cells having a floating gate or a trapping charge layer for the storage of charges thereon are well known in the art. Referring to FIG. 1 there is shown a cross-sectional view of a non-volatile memory cell 10 (split gate source side injection hot electron programming cell) of the prior art. The memory cell 10 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by an insulating layer 22, such as silicon (di)oxide. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is adjacent to and spaced apart from the coupling gate 26. The erase gate 28 can have a slight overhang over the floating gate 24. In the operation of the memory cell 10, charge stored on the floating gate 24 controls the flow of current between the first region 14 and the second region 16. Where the floating gate 24 is negatively charged thereon, the memory cell is programmed. Where the floating gate 24 is positively charged thereon, the memory cell is erased. The memory cell 10 is fully disclosed in U.S. Pat. No. 7,868,375 whose disclosure is incorporated herein in its entirety by reference.

The memory cell 10 operates as follows. During the erase operation, when electrons are removed from the floating gate 24, a high positive voltage, e.g. 8-11V, is applied to the erase gate 28. A negative voltage, e.g., −6 to −8V or ground voltage can be applied to the coupling gate 26 and/or the word line 20. Electrons are transferred from the floating gate 24 to the erase gate 28 by Fowler-Nordheim tunneling through the insulating layer between the floating gate 24 and the erase gate 28. In particular, the floating gate 24 may be formed with a sharp tip facing the erase gate 28, thereby facilitating said tunneling of electrons. During the erase operation, the high positive voltage is supplied from a charge pump 52 (shown in FIG. 2). Typically, because the erase operation involves only the removal of electrons from the floating gate 24, the charge pump 52 need not supply a large current (typically in nanoampere range).

Thereafter, the memory cell 10 can be programmed. During the programming operation, when electrons are injected to the floating gate 24 through hot-electron injection with the portion of the channel 18 under the floating gate 24 in inversion, a first positive voltage, e.g. 1V to 2V, in the shape of a pulse is applied to the word line 20 causing the portion of the channel region 18 under the word line 20 to be conductive. A second positive voltage, e.g, 8V to 10V, also in the shape of a pulse, is applied to the coupling gate 26, to utilize high coupling ratio between coupling gate 26 and floating gate 24 to maximize the voltage coupling to the floating gate 24. A third positive voltage, e.g, 3V to 6V, also in the shape of a pulse, is applied to the erase gate 28, to utilize coupling ratio between erase gate 28 and floating gate 24 to maximize the voltage coupling to the floating gate 24. A high voltage differential, e.g, 4V to 7V, also in the shape of a pulse, is applied between the first region 14 and the second region 16, to provide generation of hot electrons in the channel 18. Thus, during the programming operation a current (typically in microamperes) flows between the first region 14 and the second region 16 which must be supplied from the charge pump 52.

During the read operation, a first positive voltage, e.g., 1V to 3V, is applied to the word line 20 to turn on the portion of the channel region 18 beneath the word line 20. A second positive voltage, e.g, 0V to 4V, is applied to the coupling gate 26. A third voltage, e.g, 0V to 3V, is applied to the erase gate 28. A voltage differential, e.g, 0.5V to 2V, is applied to the first region 14 and the second region 16. If the floating gate 24 were programmed, i.e. the floating gate 24 stores electrons, then the second positive voltage applied to the coupling gate 26 and the third voltage applied to the erase gate 28 is not able to overcome the negative electrons stored on the floating gate 24 and the portion of the channel region 18 beneath the floating gate 24 remains non-conductive. Thus, no current or a negligibly small amount of current would flow between the first region 14 and the second region 16. However, if the floating gate 24 were not programmed, i.e. the floating gate 24 remains neutral or positively charged, then the second positive voltage applied to the coupling gate 26 and the third voltage applied to the erase gate 28 is able to cause the portion of the channel region 18 beneath the floating gate 24 to be conductive. Thus, a current would flow between the first region 14 and the second region 16.

As is well known, memory cells 10 are typically formed in an array, having a plurality of rows and columns of memory cells 10, on a semiconductor wafer. Referring to FIG. 2 there is shown a block level diagram of a memory device 50 of the prior art with an array 60 of memory cells 10. FIG. 3 is a more detailed diagram of the array 60 shown in FIG. 2. The array 60 comprises a plurality of subarrays 62 (a-d), with a plurality of memory cells, such as memory cells 10 arranged in a plurality of rows and columns. Associated with each row of memory cells 10 spanning across the subarrays 62a, 62b, 62c and 62d is a row decoder (aka xdec, also wordline decoder) 64. Associated with columns of memory cells 10 in each subarray, e.g. subarray 62a are sense amplifiers 70a and 70b. A column (bitline) decoder (ymux, not shown) is used to select (multiplex, decode) columns of memory cells into sense amplifiers. From the sense amplifiers 70, the signals are supplied to an output register 72. In the embodiment shown in FIG. 3, each subarray 62 is multiplexed (i.e., decoded by a ymux, not shown) into two words with each word having 16 bits. In one embodiment in the subarray array 62, each row has 2048 memory cells, the first 1024 cells is multiplexed into a $1^{st}$ word (to be programmed) and the second 1024 cells is multiplexed into a $2^{nd}$ word (to be programmed).

During erase, a block or group of units (such as a number of bytes (with 8 bits to a byte)) of memory cells are erased at once. The erase operation places the plurality of bits into a state of "FF" (hex), or "11111111". During programming, selected bits of a byte are programmed by injecting electrons onto the floating gate into the logical state of "0". However, the charge pump 52 must be able to supply programming current as if all of the bits of a byte are to be programmed. Thus, the charge pump 52 must be designed with the ability to supply programming current as if all the bits of the byte were to be programmed to the state of "00" (hex), or "00000000". Furthermore, to increase performance, a number of bytes are programmed simultaneously. This adds further burden on the charge pump 52 to provide a large programming current. Since a charge pump 52 capable of providing a large current requires a large amount of real estate on the silicon die, a larger charge pump 52 takes up more silicon real estate. Thus, it is one objective of the present invention to reduce the size of the charge pump 52.

Finally, parity bits are well known in the art. A parity bit is a bit associated with a plurality of bits (such as a byte) in which the parity bit is programmed to a state representing an error check on the data stored in the byte. However, typically parity bits have been used with volatile memory cells, and have been used only for error correction.

SUMMARY OF THE INVENTION

The present invention is a non-volatile memory device that has a charge pump for providing a programming current. The memory device has an array of non-volatile memory cells, with each memory cell programmed by the programming current. The array of non-volatile memory cells is partitioned into a plurality of units, with each unit comprising a plurality of memory cells. An indicator memory cell is associated with each unit of non-volatile memory cells. A programming circuit programs the memory cells of each unit using the programming current, when a certain percentage or less of the memory cells of each unit is to be programmed, and programs the inverse of the memory cells of each unit and the indicator memory cell associated with each unit, using the programming current, when more than the certain percentage of the memory cells of each unit is to be programmed.

The present invention is also a method of programming a non-volatile memory device which relies on a charge pump supplying a programming current during the programming operation.

DETAILED DESCRIPTION OF THE PREFERRED EMBODIMENT

Figure 2:
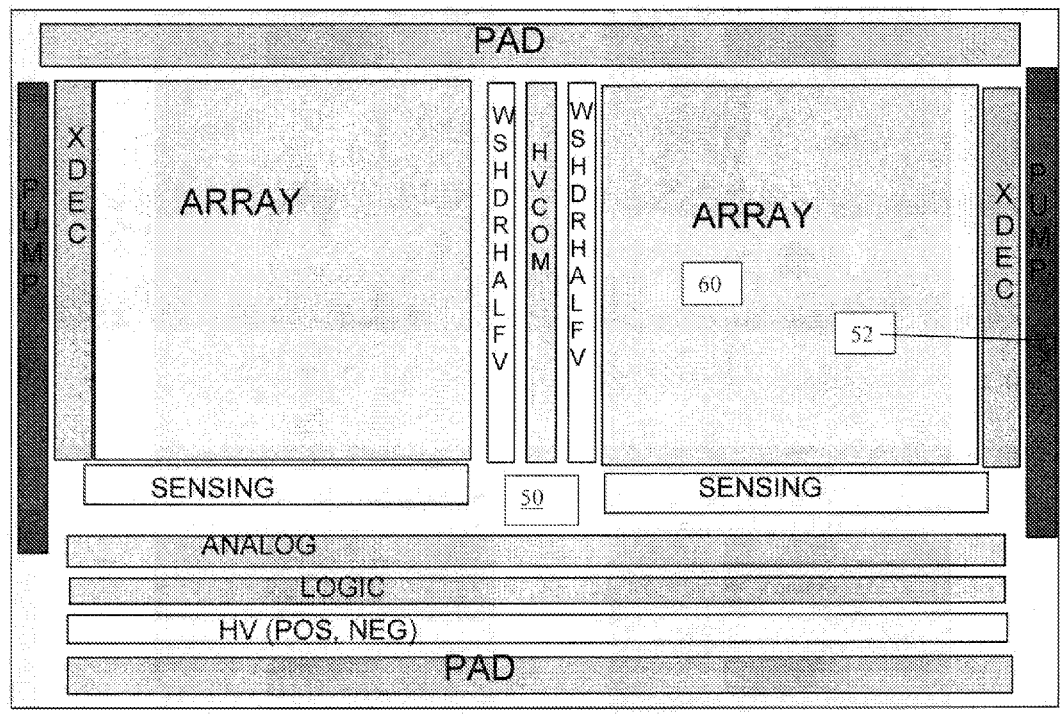
FIG. 2 is a block level diagram of a non-volatile memory device of the prior art including the charge pump that provides a programming current for use during the programming of the non-volatile memory cells.
Figure 3:
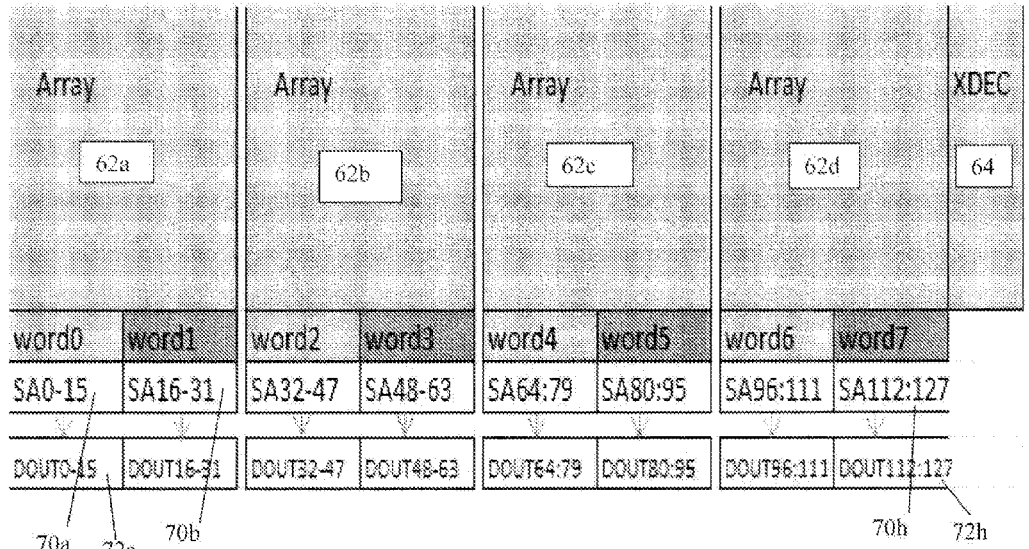
FIG. 3 is a detailed block level diagram of the array portion of the non-volatile memory device of the prior art shown in FIG. 2.
Figure 4:
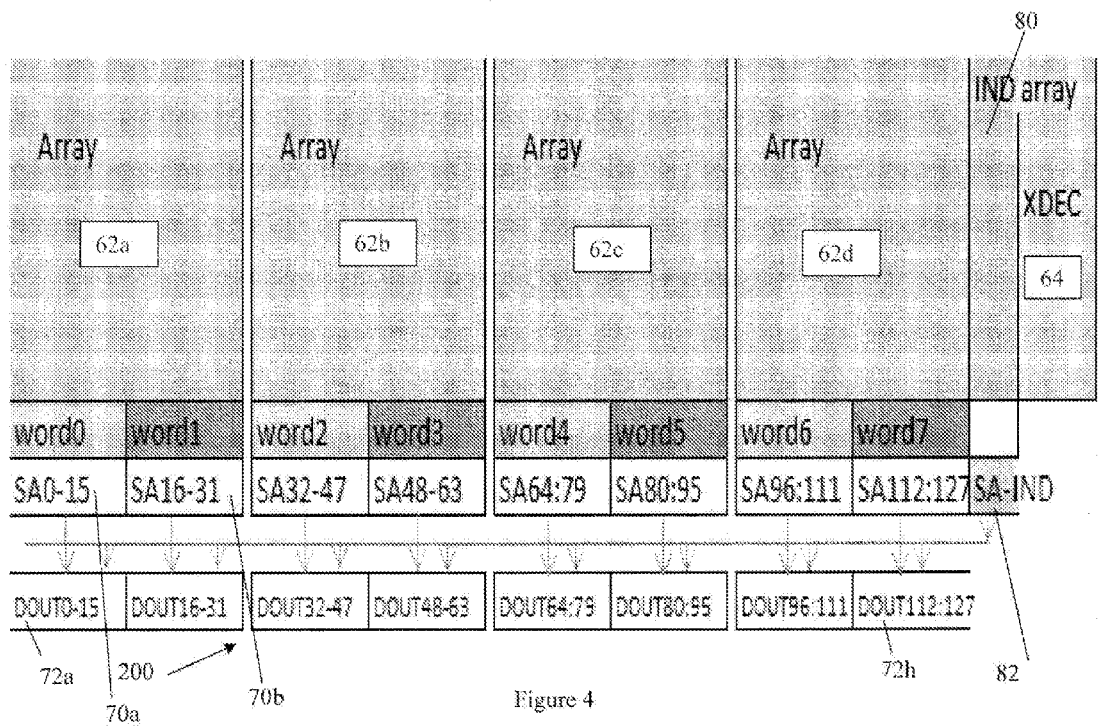
FIG. 4 is a detailed block level diagram of the array portion of one embodiment of the non-volatile memory device of the present invention.

Referring to FIG. 4 there is shown a block level diagram of one embodiment of the non-volatile memory array 200 of the present invention. The non-volatile memory array 200 can be used in the non-volatile memory device 50 shown in FIG. 2 in place of the array 60. Since the memory array 200 of the present invention is similar to the memory array 60, same numerals will be used for like parts.

The array 200 comprises a plurality of subarrays 62 (a-d), with a plurality of memory cells, such as memory cells 10 arranged in a plurality of rows and columns. Associated with each row of memory cells 10 spanning across the subarrays 62a, 62b, 62c and 62d is a row decoder 64. Associated with each column of memory cells 10 in each subarray, e.g. subarray 62a are sense amplifiers 70a and 70b. From the sense amplifiers 70, the signals are supplied to an output register 72. In the embodiment shown in FIG. 4, each subarray 62 has multiple rows with each row having 2048 memory cells 10, the first 1024 cells is multiplexed into a $1^{st}$ word (each word having 16 bits to be programmed) and the second 1024 cells is multiplexed into a $2^{nd}$ word (to be programmed). An entire row of memory cells 10 in the array 60 thus comprising multiple units of 128 memory cells 10 with each unit being multiplexed into eight words word0-word7 and coupled into the sense amplifier SA0-SA127 70.

The array 200 further comprises an array 80 of memory cells (called indicator memory cells), which can be of the same type of memory cells as used in the subarrays 62(a-d), namely memory cells 10, each row of array 80 has multiple indicator memory cells. The array 80 of memory cells is positioned between the subarray 62(*d*) and the row decoder 64, with one row of indicator memory cells 10 associated with each row of memory cells 10 in the subarrays 62(*a-d*). The position of the indicator cell array 80 is immediately adjacent to the row decoder 64 to have the fastest access time from row decoding to lessen the impact of the overall speed due to logic associating with the indictor bit. In one embodiment one indicator cell is associated with two selected words (32 selected memory cells 10) in each subarray 62. In another embodiment, one indicator memory cell 10 is associated with each selected unit of eight words (128 memory cells 10). Of course, as will be seen hereinafter, the invention is not so limited, and each indicator memory cell 10 may be associated with a unit of memory cells, with the unit of memory cells having any number. A sense amplifier 82 is associated with the indicator memory cells 10 in the array 80. As will be seen, the output of the sense amplifiers 82 gate the output from the sense amplifiers 70(*a-h*) into the registers 72(*a-h*). In one embodiment each indicator bit (cell) consists of one (basic) memory cell 10. In another embodiment, each indicator bits consists of 2 or more (basic) memory cell 10, in this case sensing of the indicator cell would be faster to not impact overall speed due to checking and the inversion of the data out.

The operation of the present invention may best be understood by the following example. Let us assume that a unit of memory cells 10 with which the indicator memory cell 10 is associated is a byte or 8 bits. After the byte or 8 bits is erased, it is in the state of "FF" (hex) or a bit pattern of "11111111". If the new data to be programmed into the byte is "00000000", then instead of supplying the programming current sufficient to change the state of 8 memory cells 10, the memory device 200 of the present invention instead merely programs the associated indicator memory cell 10 from "1" to "0" and keeps the state of the bits of the associated byte at "11111111". In this manner, only 1 bit is programmed, and programming current sufficient to program only 1 memory cell 10 needs to be provided by the charge pump 52.

Other examples of the present invention are as follows. Again let us assume that a unit of memory cells 10 with which the indicator memory cell 10 is associated is a byte or 8 bits. After the byte or 8 bits is erased, it is in the state of "FF" (hex) or a bit pattern of "11111111". If the new data to be programmed into the associated byte is "01010101", which is fifty percent of the bits in the associated unit, then the programming circuit causes the bit pattern of "01010101" to be programmed into the bits of the associated byte. In this case, only 4 bits are programmed, and the total programming current required is for the programming of four bits. However, if the new data to be programmed into the associated byte is "01010100", which is more than fifty percent of the bits in the associated byte, then the programming circuit causes the inverse bit pattern, or "10101011" to be programmed into the bits of the associated byte and causes the associated indicator bit to be programmed into a state of "0". In this example, again only 4 bits are required to be programmed and the total programming current is again only 4 bits. As can be seen from these examples, by the method of the present invention, compared to the array 60 of the prior art, the maximum amount of programming current that the charge pump 52 needs to supply to program the array 200 is only one-half or fifty percent of the programming current that was otherwise required for the memory array 60 of the prior art. In this described method the data pattern to be stored is mostly '1' data (since if more than fifty percent '0' data would be inverted into '1' data). Alternative embodiments needs not be exactly fifty percent but could be approximately fifty percent or any number of percentage. In case of less than fifty percent the chip operation is less optimal.

Figure 5:
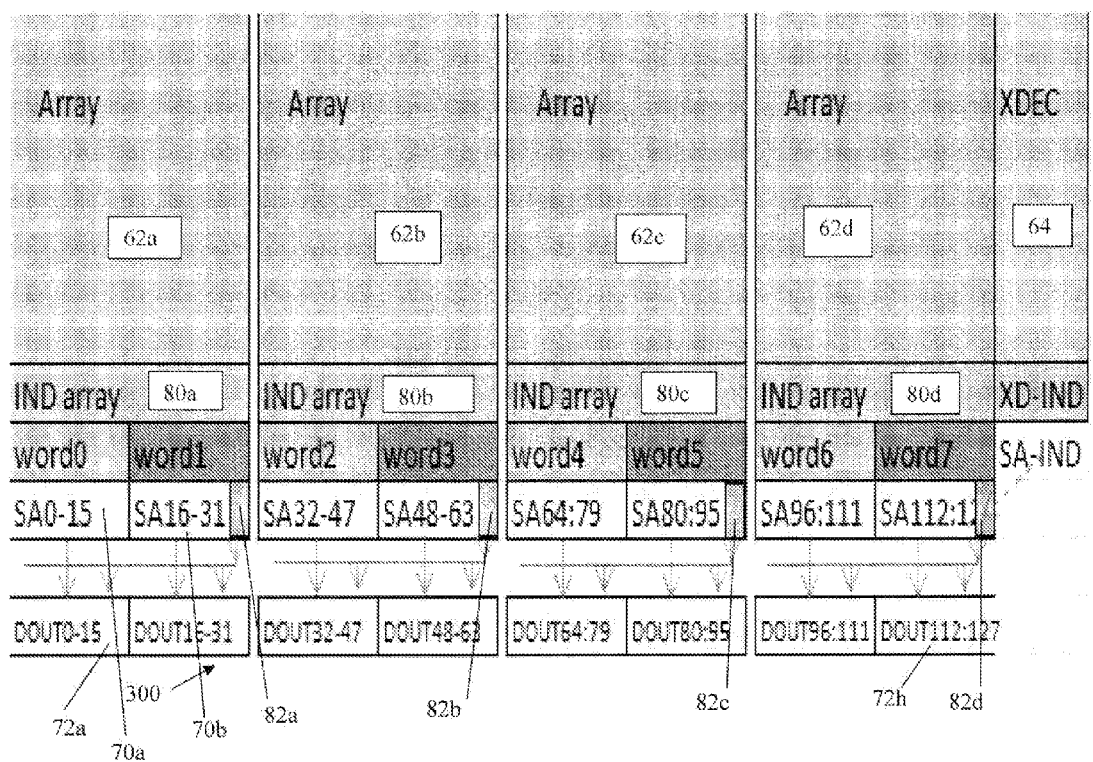
FIG. 5 is a detailed block level diagram of the array portion of another embodiment of the non-volatile memory device of the present invention.

Referring to FIG. 5 there is shown a block level diagram of another embodiment of the non-volatile memory array 300 of the present invention. The non-volatile memory array 300 is similar to the non-volatile memory array 200 shown in FIG. 4 and can be used in the non-volatile memory device 50 shown in FIG. 2 in place of the array 60. Since the memory array 300 of the present invention is similar to the memory array 200, same numerals will be used for like parts.

The array 300 comprises a plurality of subarrays 62 (*a-d*), with a plurality of memory cells, such as memory cells 10 arranged in a plurality of rows and columns. Associated with each row of memory cells 10 spanning across the subarrays 62*a*, 62*b*, 62*c* and 62*d* is a row decoder 64. Associated with each column of memory cells 10 in each subarray, e.g. subarray 62*a* are sense amplifiers 70*a* and 70*b*. From the sense amplifiers 70, the signals are supplied to an output register 72. In the embodiment shown in FIG. 5, each subarray 62 has multiple rows with each row having 2048 memory cells 10, the first 1024 cells is multiplexed into a $1^{st}$ word (each word having 16 bits to be programmed) and the second 1024 cells is multiplexed into a $2^{nd}$ word (to be programmed). An entire row of memory cells 10 in the array 60 thus comprising units of 128 memory cells 10 with each unit being multiplexed into eight words word0-word7 and coupled into the sense amplifier SA0-SA127 70.

The array 300 further comprises a plurality of arrays 80(*a-d*) of memory cells (called indicator memory cells), which can be of the same type of memory cells as used in the subarrays 62(*a-d*), namely memory cells 10. Each array 80 of indicator memory cells is associated with a subarray 62 of memory cells and is positioned between the associated subarray 62 and the associated sense amplifiers 70, with one indicator memory cell 10 associated with associative columns of memory cells 10 in the subarray 62. Similar to the previous discussion regarding each indicator memory cell being associated with a row of memory cells, each indicator memory cell 10 need not be associated with one column of memory cells and may be associated with a unit of memory cells, with the unit of memory cells having any number. Associated with each array 80 of indicator memory cells is a sense amplifier 82, whose output gates the output from the sense amplifiers 70 into the registers 72.

Figure 6:
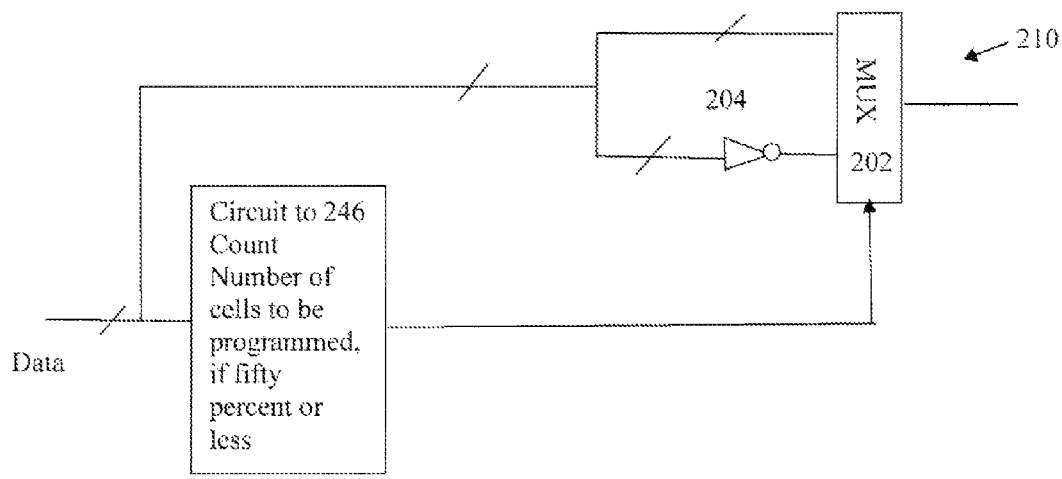
FIG. 6 is a block level diagram of the programming circuit for use in the non-volatile memory device of the present invention.

Referring to FIG. 6 there is shown a circuit 210 for testing the data to be programmed to determine whether the data or its inverse is to be programmed in accordance with the method of the present invention. The circuit 210 comprises a digit counter circuit 246, an inverting circuit 204 and a multiplexer MUX 202. The digit counter circuit 246 is used to count the number of logical bit '0' in the datain stream. If the number of logical bit '0' is more than a certain predetermined digit percentage, e.g. 50%, the data is inverted through the selection MUX 202 and the inverting circuit 204. Alternatively, a digit percentage may be employed, e.g, 33%, 66%, 51%. The output of the MUX circuit 202 is the data to be stored into the memory cells 10.

Figure 7:
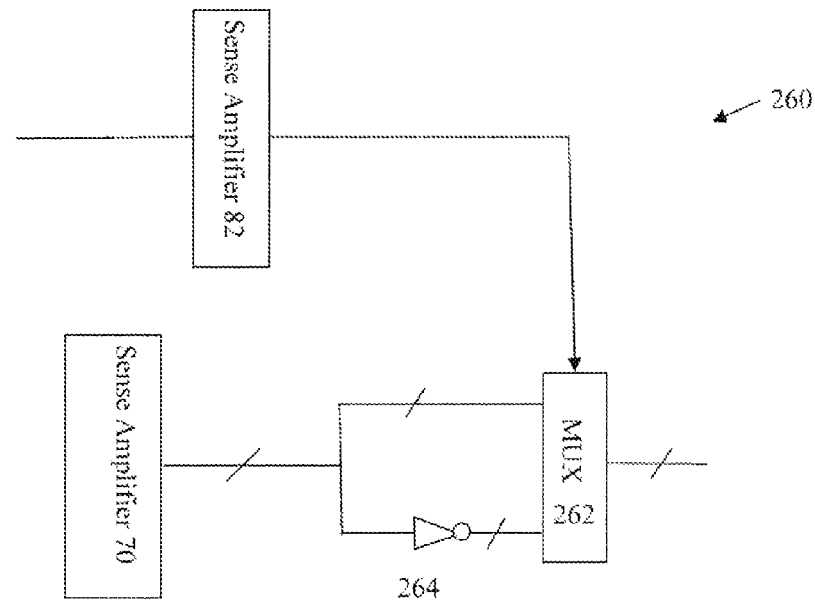
FIG. 7 is a block level diagram of the read out circuit for use in the non-volatile memory device of the present invention.

Referring to FIG. 7 there is shown a data out mux circuit 260 for gating the outputs from the sense amplifiers 70 into the registers 72 in accordance with the method of the present invention. The data out mux circuit 260 includes the indicator sense amplifier 82, the sense amplifier 70, an inverting circuit 264, and a multiplexing circuit MUX 262. Input to the indicator sense amplifier 82 is the indicator memory cells from the array 80. Input to the sense amplifier 70 is the memory cells 10 from the array 62. Depending on the output of the indicator sense amplifier 82, the output of the sense amplifier 70 is fed through or inverted by the MUX 262 and the inverting circuit 264. The output of the MUX 262 typically goes to a DOUT (Data Output) circuit 72 which is coupled to an IOBUF (Input/Output Buffer) circuit.

Figure 8:
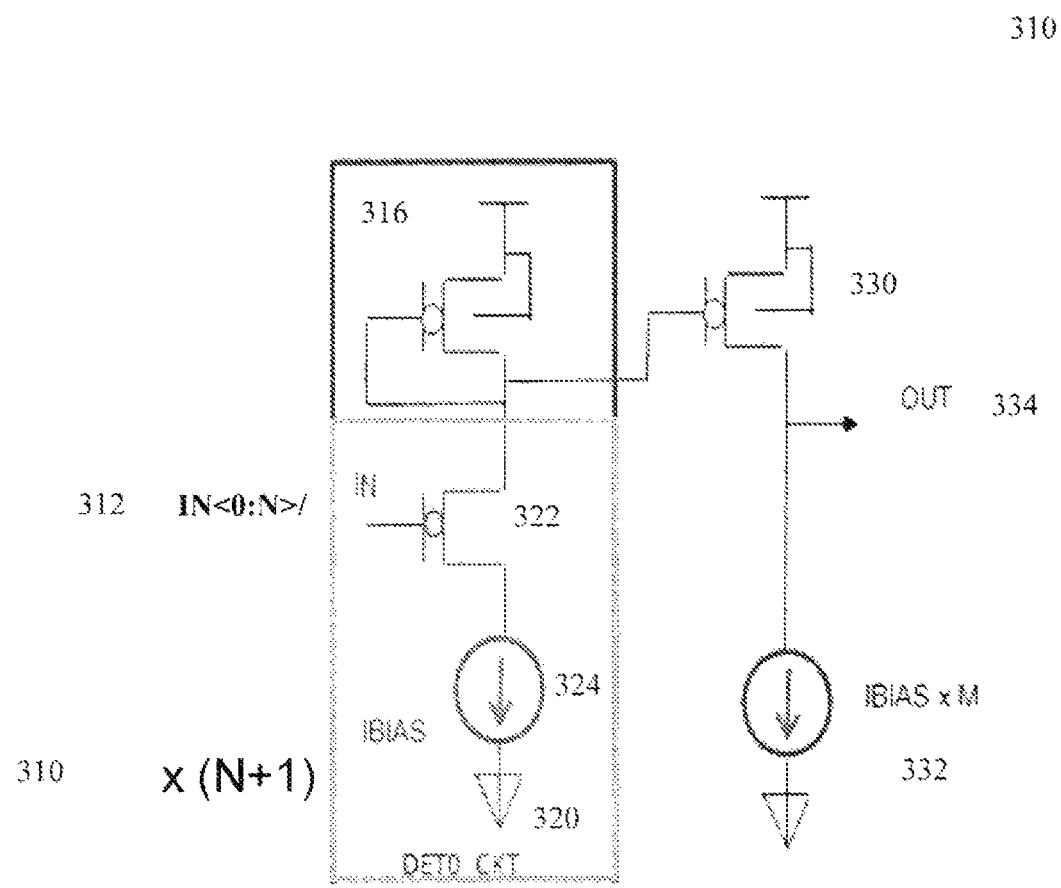
FIG. 8 is a datain '0' detect analog circuit for use in the non-volatile memory device of the present invention

Referring to FIG. 8 there is shown an analog digit '0' counter (detection) circuit 310. The circuit 310 includes a plurality of enabling bias circuit 320, a PMOS transistor 316, a PMOS transistor 330, a current bias circuit 332. The enabling bias circuit 320 includes a current bias circuit IBIAS 324 and a NMOS transistor 322. Input to the gate of the NMOS 322 is the inverted datain IN/, hence if datain IN='0', the inverted datain IN/='1' will enabling the NMOS transistor 322. The bias circuit 324 is implemented as a unit bias current IBIAS, e.g., IBIAS=2 uA. For example there is 16 datain IN<0-15>, hence there is 16 circuit 320. For example if there is 9 datain='0' (other 7 datain='1'), leading to 9 units of bias current IBIAS 324 enabled into the PMOS 316. This current is mirrored into the PMOS transistor 330. For example the circuit 332 has M×IBIAS with M=8 and IBIAS=2 uA. The current in the PMOS 330 is 9×IBIAS while the current in the circuit 332 is 8×IBIAS, hence the output 334 will be pulled high indicating number of digit '0' is more than 8 out of 16 datain bits. The circuit 310 operates on all datain bits at the same time.

Figure 9:
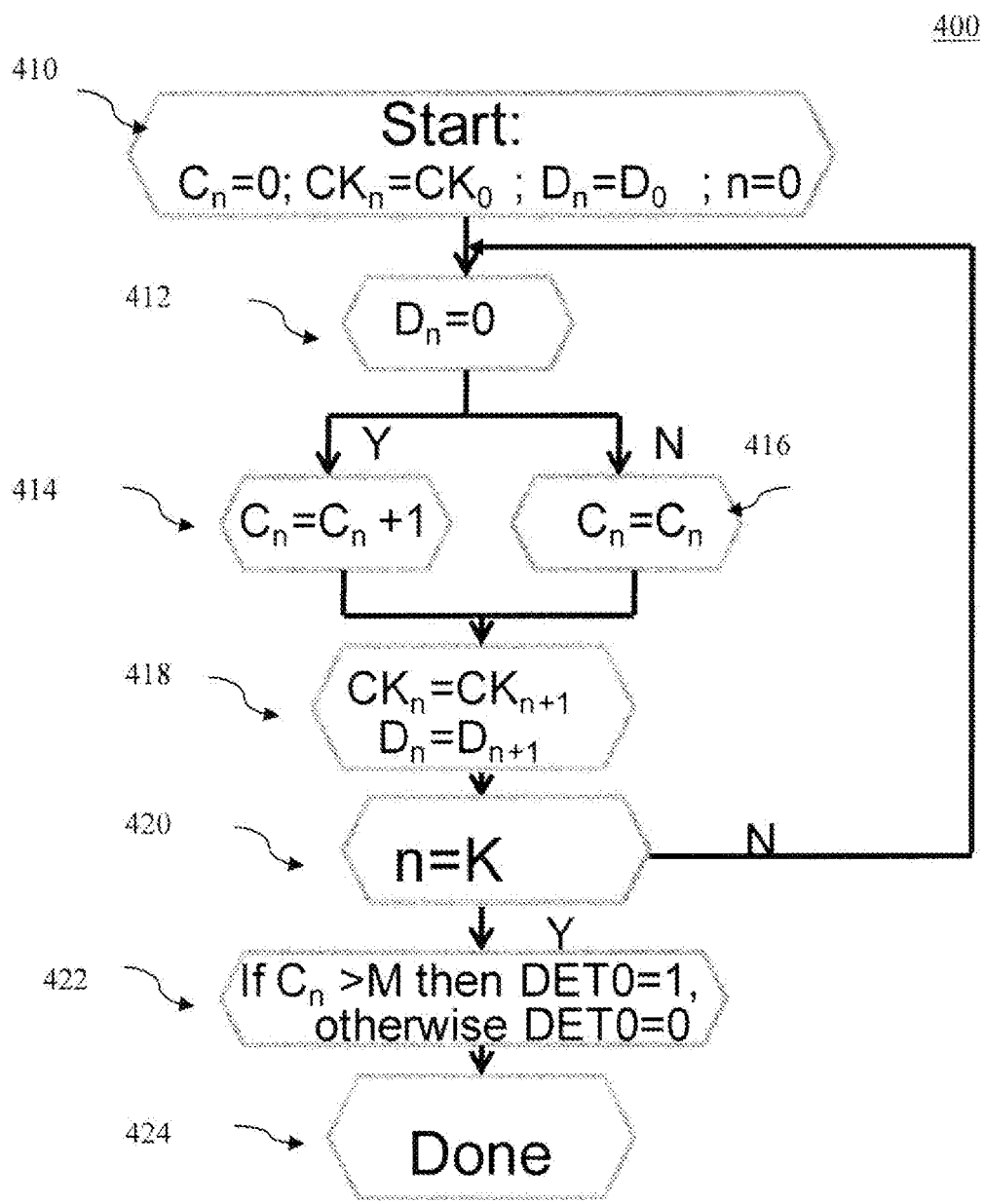
FIG. 9 is a flow diagram for datain '0' analog detecting for use in the non-volatile memory device of the present invention

Referring to FIG. 9 there is shown a flow chart algorithm of digital digit '0' detection. At start step 410, initialization sequence initialize Dn=D0 (first datain out of for example 64) and clock pulse CKn=CK0 (first clock), and Count Cn=0. Next in step 412 checking if datain Dn=0 (digit '0'), if Y (yes) then goes to step 414 to increase the count Cn by 1 (Cn=Cn+1), if N (no) then goes to step 416 to keep the count Cn same as current count. Next goes to step 418 to increase the clock pulse to next clock pulse CKn=CKn+1 and inputting next datain Dn=Dn+1. Next goes to step 420 and check if n=K, for example, K=64, if No then goes back to the step 412 loop and repeat checking for digit '0'. If n=K-> Yes then goes to step 422. Now check if count Cn>M, e,g, M=33, if true then detect '0' DET0=true=1, if not then DET0=false=0. Next is final step 424=done sequence.

Figure 10:
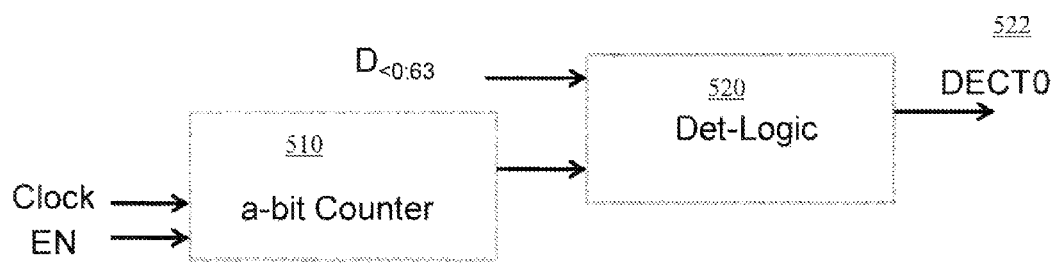
FIG. 10 is a block diagram of datain '0' detect digital circuit for use in the non-volatile memory device of the present invention

Referring to FIG. 10 there is shown a digital digit '0' detection circuit 500. The circuit 500 includes a a-bit Counter 510 and a detect logic Det-Logic circuit 520. The a-bit counter provides the clocking pulses CKn and the detect logic 520 provides the digit '0' checking for Dn, the increment function for Cn, Dn,CKn, the checking for count Cn, the initialization, start, and done function. For example for 64 datain bits D<0:63>, if there are 33 datain=0, the output DECT0 522=1 to indicate number of the '0' digits is more than 32 out of 64. The circuit 500 operates sequentially on bit by bit at a time, for example for 64 datain bits, it operates on 64 clock pulses.

Figure 11:
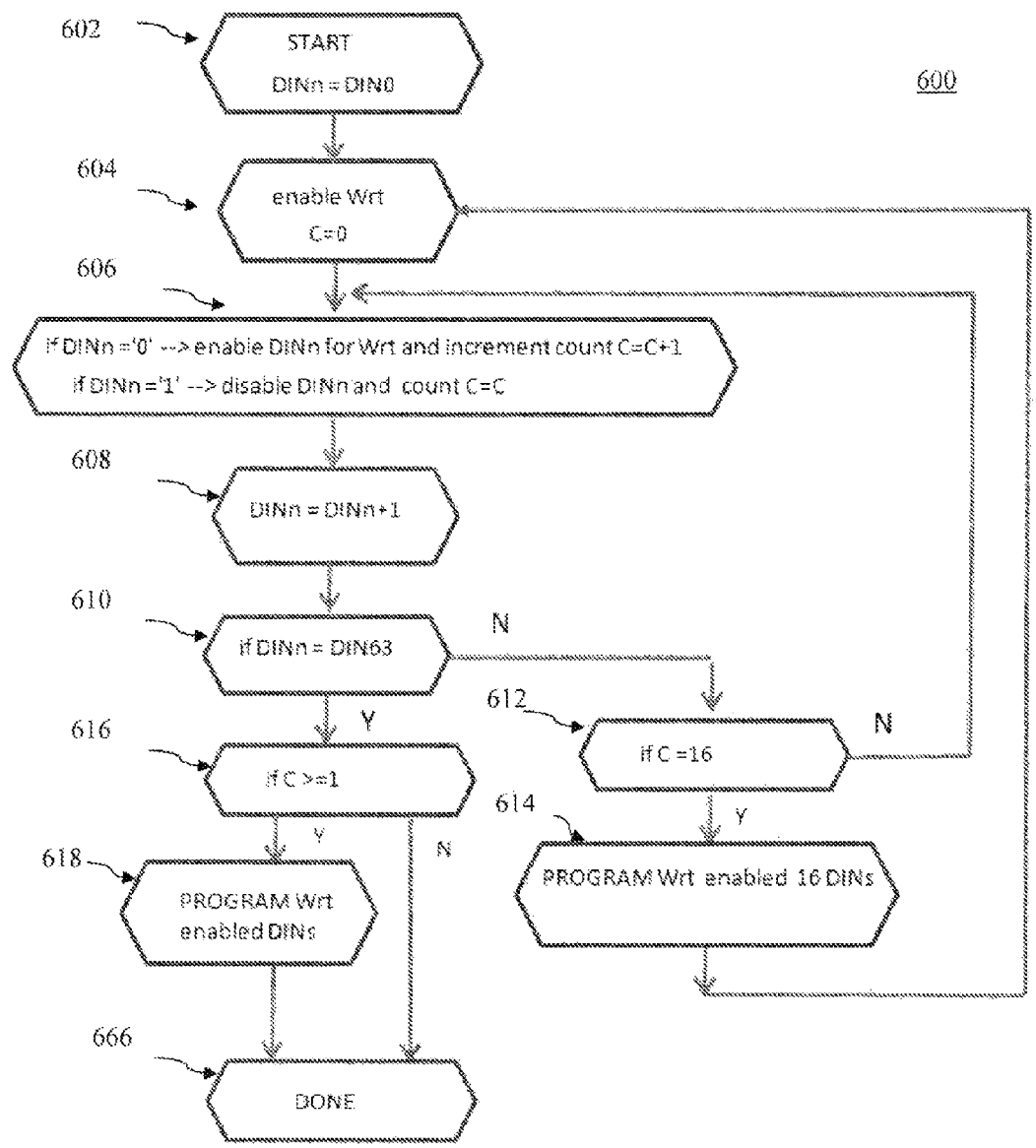
FIG. 11 is a flow diagram for programming for use in the non-volatile memory device of the present invention
Figure 12:
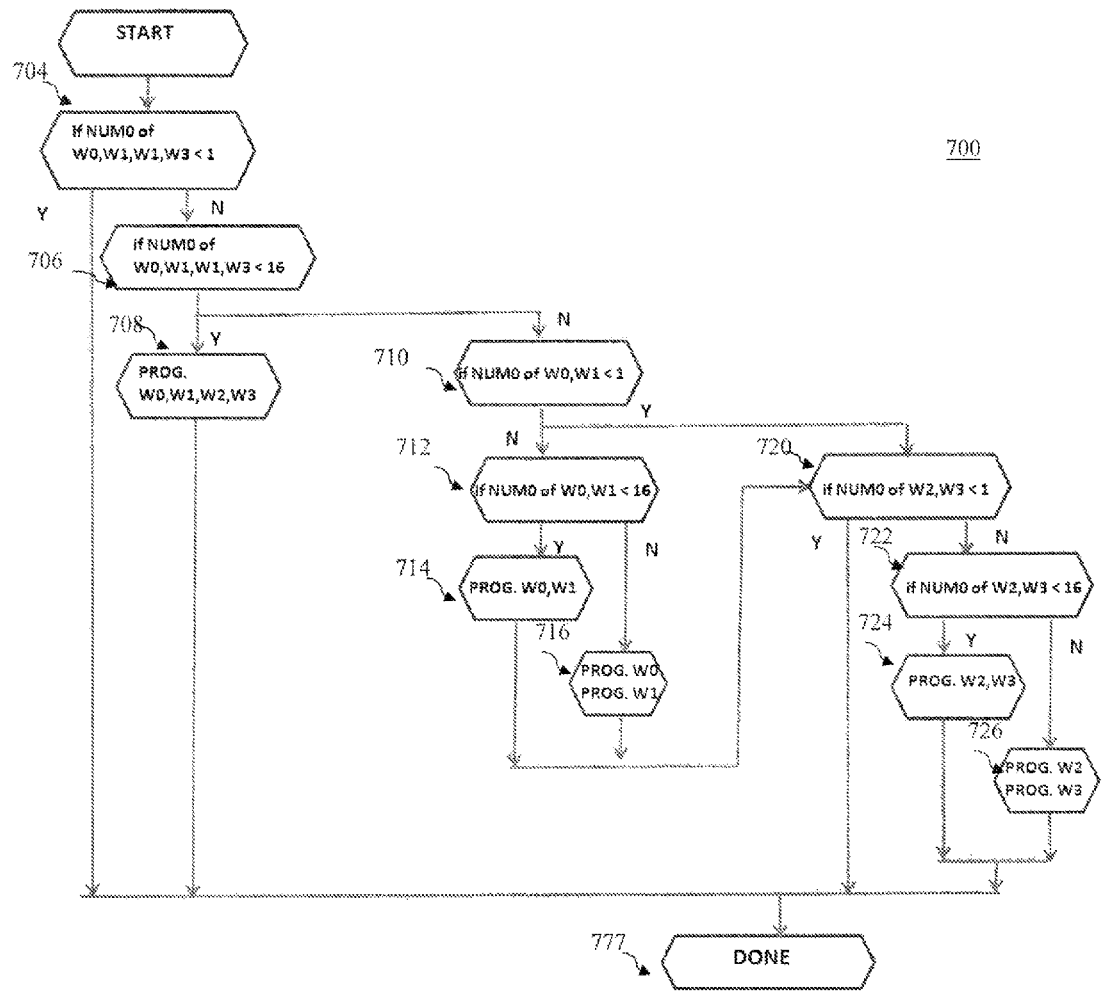
FIG. 12 is an alternative flow diagram for programming for use in the non-volatile memory device of the present invention
Figure 13:
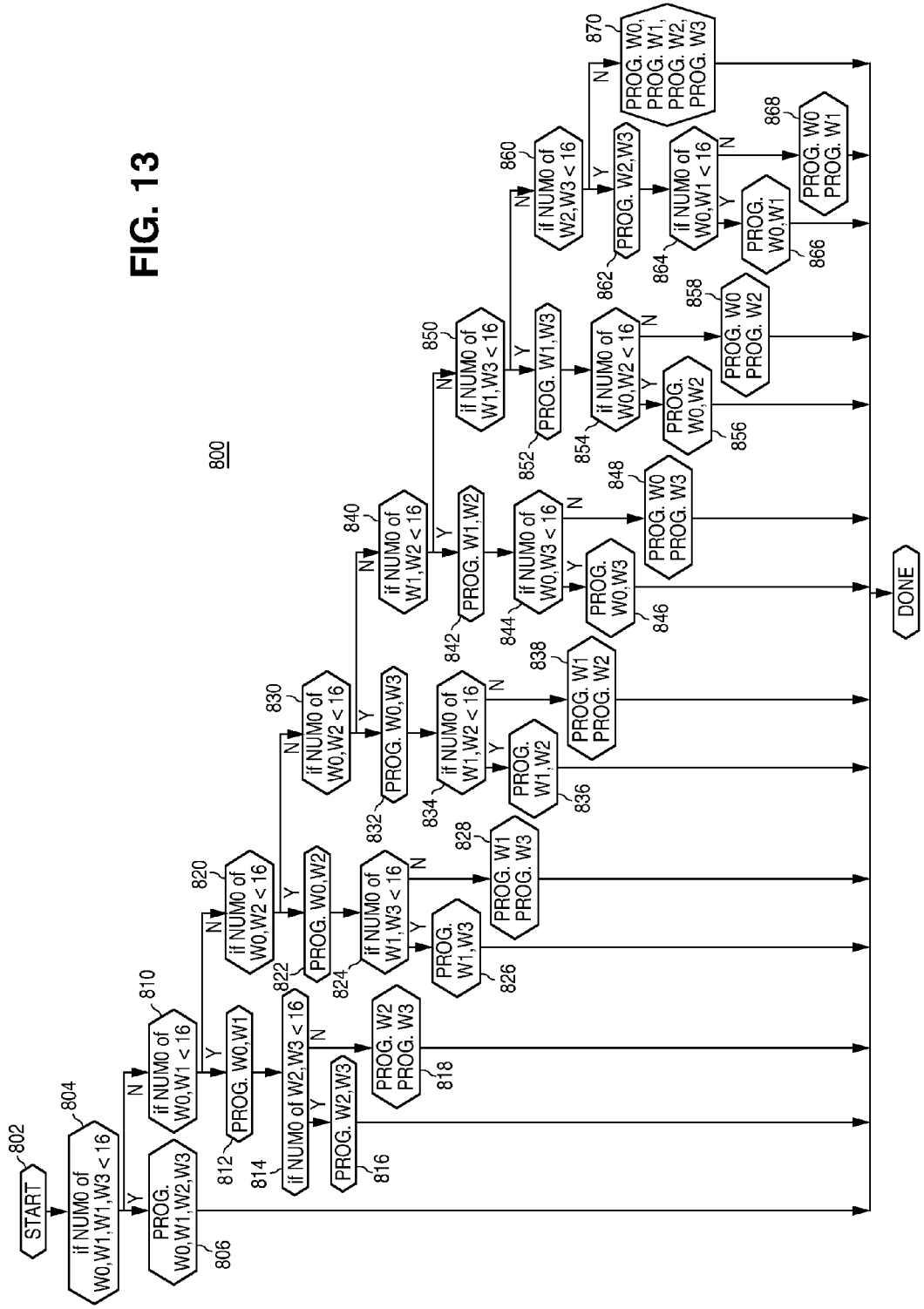
FIG. 13 is another alternative flow diagram for programming for use in the non-volatile memory device of the present invention

The programming algorithms in FIGS. 11, 12, and 13 can be used in combination thereof with the above described inventions for further operational optimization in operating only on needed data bits.

Referring to FIG. 11 there is shown a flow chart of programming algorithm 600 for efficient programming of '0' datain pattern. In this embodiment there are 64 datain bits (in FIGS. 4 and 5 there are 128 datain bits) and 16 bits of '0' datain can only be programmed at a time (meaning the high voltage charge pump is design to supply for 16 bits at a time (to minimize charge pump area) in programming, for example to program 32 bits would needs two programming pulses operating sequentially with each programming pulse programs 16 bits at a time). The algorithm will start from first datain and count number of '0' datain digit, once 16 '0' digits is reached, a program (write) operation is performed to program these 16 bits into appropriate memory cells 10, meaning changing memory cell storage state of these cells from erase state ('1') to program state ('0'). After this programming is done, next is to count and identify the next 16 '0' datain digits to be programmed. The sequence continues until all 64 datain is accounted for programming operation.

The program algorithm sequence works as following. After an erase operation to erase all selected memory cells, the algorithm 600 is used to program the datain into in the memory cells 10. At step start 602, initialization step initialize Dinn=Din0, next is step 604 to enable count C=0, next is step 606 for checking if DINn=0 then enabling DINn to be programmed (written) later and increment count C by 1 (C=C+1), if DINn=1 then disable DINn for later programming operation and keep count C current. Next is step 608 to goes to next datain DINn=DINn+1, next is the step 610 to check if last datain has been reached DINn=DIN63. If No then goes to step 612 to check of count C has reached 16, if Yes goes to step 614 to perform an program operation on these 16 enabled datain DINn. If C is not 16, then goes back to the step 606 to check to enable the next '0' datain. If in the step 610, DINn=DIN63 then goes to step 616, if now count C<1 (there is no memory cell needs to be programmed) then goes to final step 666 Done, if C>=1 then goes to step 618 to perform an program operation on datain bits that has been enabled for programming and then goes to the final step 666 Done.

Referring to FIG. 12 there is shown a flow chart of another programming algorithm 600 for efficient programming of '0' datain pattern. In this embodiment the '0' digit detection is operated on word (16 bits) basis. The number of zeros of the selected words can be programmed (written) is 16 at a time in this embodiment. Example shown is for four words in this embodiment. This algorithm only program the necessary words with '0' digits, meaning changing memory cell storage state from erase state ('1') to program state ('0'). This method is less efficient than that in FIG. 11 (which operates on bits instead of words) but requires simpler implementation.

The algorithm works as following. First is start step 702 which initializes any necessary parameters. Next is step 704 if check for number of '0' digit of 4 words W0-3 is <1 (no cell memory cell needs to be programmed), if yes then goes to final step 777 done (meaning no programming operation needs to be done). If no then goes to step 706 to check for if number of '0' digits of 4 words W0-3 is <16, if Yes then goes to step 708 to program all words (since number of bits to be programmed is less than 16 bits, which is the number of bits that can be programmed at the same time) and then goes to the final step 777 done. If in step 706, if number of '0' digit of 4 words W0-3 <16 is No, then goes to step 710 to check for number of '0' digit of 2 words W0,W1 <1, if No then goes to step 712 to check number of '0' digit of 2 words W0,W1 is <16, if Yes then program both words W0,W1 at same time then goes to step 720, if No then program W0 and program W1 individually (i.e., sequentially one word at a time) then goes to the step 720. If in the step 710, the answer is Yes then goes to the step 720. In the step 720, now check for number of '0' digit of word W2,W3 <1, if Yes then goes to the final step 777 done, if No then goes to step 722 to check for number of '0' digit of words W2, W3 <16. If yes then goes to step 724 to program both words W2, W3 at the same times, if No then goes step 726 to program word W2, W3 individually (sequentially) then goes to the final step 777 done.

Referring to FIG. 13 there is shown a flow chart of another programming algorithm 600 for efficient programming of '0' datain pattern. In this embodiment the '0' digit detection is operated on word (16 bits) basis. The number of zero s of the selected words can be programmed (written) is 16 at a time in this embodiment. Example shown is for four words in this embodiment. This algorithm only program the necessary words with '0' digits. This method is more efficient than that in FIG. 12 but requires more complex implementation for more exhaustive word combination check.

The algorithm works as following. First is step 802 start to initialize any necessary parameters. Next is step 804 which check for number of '0' digit in datain of 4 words W0-3 <16. If Yes then goes to step 806 to program all words at same time and then goes to final step 888 done. If no then goes to step 810 to check for number of '0' digit for words W0, W1 <16. If Yes then goes to step 812 to program both words W0, W1 at same times. After step 812 goes to step 814 to check for number of '0' digit of words W2, W3 <16. If yes the goes to step 816 to program both words W2, W3 at the same times and then goes to the final step 888 done. If at step 814 the answer is No then goes to step 818 to program W2 and program W3 individually (sequentially) then goes to the final step 888 done. Similarly steps 820-828, steps 830-838, steps 840-848, steps 850-858, steps 860-868 for the exhaustive combinations of rest of the 4 words is similar to step 810-818. The Step 870 program each word W0, W1, W2, W3 individually and then goes to the final step 888 done.

An array architecture for the above four word datain (64 datain bits) in FIGS. 12 and 13 is one that is similar to the array 200 or array 300 in FIGS. 4 and 5 respectively that consists of sub-arrays 62a and 62 b only (no subarrays 62c or 62d).

For the memory array that consists of plurality of subarrays (62a-d), in the case that a selected (enabled) word or words that are to be programmed the subarrays that associates with these words are enabled (programming biases, programming high voltage, and circuit is enabled to come into the array memory cells 10) and the sub-arrays that associated with the unselected (disabled) words are disabled (programming biases, programming high voltage, and circuit is disabled from coming into the array memory cells 10) to minimize any programming high voltage and biases from disturbing on the unselected subarrays.

In the above described inventions the indicator bit and operational algorithms is associated with the programming data pattern. And the datain '0 is associated with programmed state. Data '1' can be associated with programmed state by inverting the datain and inverting the data out. Alternative embodiment has indicator bit and operational algorithms associated with erase data pattern for technology that can be optimized for erasing operation.

Another embodiment has indicator bit and operational algorithms associated with data pattern for technology that can be optimized for endurance (number of erase/program cycles for operating lifetime) and data retention (ability to hold data permanently for operating lifetime, e.g., 10 years), for example endurance and data retention preferring '1' state for best endurance and data retention performance then data pattern to be stored in memory would be more data in '1' state after being processed by operational algorithm. Another embodiment has indicator bit and operational algorithms associated with data pattern for technology that can be optimized for disturb (meaning less changing in data state of unselected cells in erase or programming operation) in that certain data pattern is less prone to disturb.

Another embodiment has indicator bit and operational algorithms associated with data pattern for technology and/or design that can be optimized for overall optimal bit error rate (BER) (meaning less changing in data state of memory cells in erase or programming or read operation). This would involve characterization of technology and product design of operational modes over operating lifetime and user applications to find algorithm for best fit data pattern (for example mostly '1' or mostly '0' data pattern) to be stored in memory cells.

Another embodiment has indicator bit and operational algorithms associated with data pattern for technology that is to be optimized for read power consumption (such as data pattern to be stored in memory would be more data '0' state after being processed by the algorithm for the memory cell 10, since in '0' state there is no memory cell current, meaning no power consumption from memory cell 10). Another embodiment has indicator bit and operational algorithms associated with data pattern for technology and design that is to be optimized for overall power consumption of all operational modes (e.g, read, program, erase) according to a power profile depending on user usage.

Figure 1:
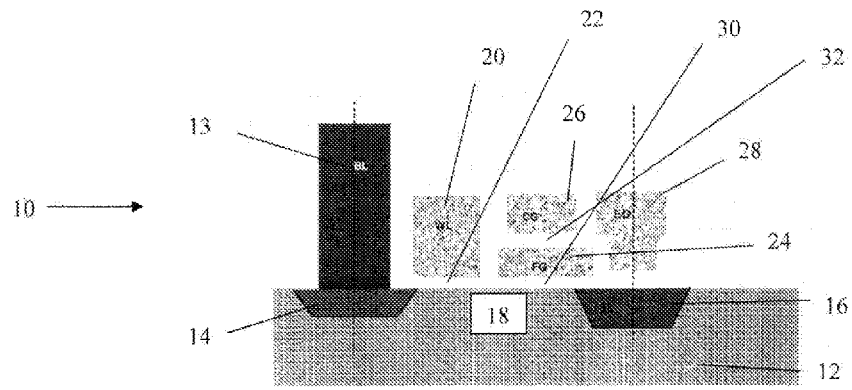
FIG. 1 is a cross-sectional view of a non-volatile memory cell of the prior art with a floating gate for the storage of charges thereon to which the programming method of the present invention is applicable, and which can be used in the memory device of the present invention.

As can be seen from the foregoing, the present invention can be applied to any non-volatile memory device which requires a charge pump to supply a programming current. Thus, the present invention can be applied to a non-volatile memory device with a floating gate for storage charges, with a charge pump to store charges on the floating gate during programming, and is not limited to the type of memory cell 10 shown in FIG. 1. Moreover, the present invention can also be applied to a memory device with a trapping charge layer for storing charges with a charge pump to store charges in the trapping charge layer during programming.

What is claimed is:
1. A non-volatile memory device comprising:
a charge pump for providing a programming current;
an array comprising a plurality of sub-arrays of non-volatile memory cells, with each memory cell programmable by the programming current;
a plurality of arrays of indicator memory cells, wherein each array of indicator memory cells is associated with one of the plurality of sub-arrays;
a plurality of sets of a plurality of sense amplifiers, wherein each set of a plurality of sense amplifiers is associated with one of the plurality of sub-arrays;
a counter circuit for counting the number of memory cells for a selected sub-array to be programmed, the counter circuit configured to check the bits to be programmed for '0' bits;
a programming circuit for programming a unit of memory cells of the selected sub-array to be programmed using said programming current, when an output of the counter circuit indicates a certain percentage or less of the memory cells of the unit is to be programmed, and for programming the inverse of the memory cells of the unit and the indicator memory cell associated with the selected sub-array, using said programming current, when the output of the counter circuit indicates more than said certain percentage of the memory cells of the unit is to be programmed; and
an output circuit comprising:

an indicator memory cell sense amplifier for sensing a value stored in an indicator memory cell associated with a sub-array to be read; and a multiplexor configured to receive as a first input an output of the set of a plurality of sense amplifiers associated with the sub-array to be read and to receive as a second input an inversion of the output of the plurality of memory cell sense amplifiers associated with the sub-array to be read and to generate as an output the first input or second input based on an output of the indicator memory cell sense amplifier.

2. The memory device of claim 1 wherein each of said memory cells comprises:

a semiconductor substrate of a first conductivity type, having a planar surface;

a first region of a second conductivity type on the planar surface;

a second region of the second conductivity type on the planar surface, spaced apart from the first region, with a channel region therebetween;

a floating gate, spaced apart from a first portion of the channel region;

a word line, adjacent to the floating gate to one side thereof, insulated therefrom, and spaced apart from a second portion of the channel region;

an erase gate, adjacent to the floating to gate to another side thereof, insulated therefrom, and spaced apart from the second region; and a coupling gate over the floating gate, spaced apart therefrom, and between word line and the erase gate and insulated therefrom.

3. The memory device of claim 1 wherein said certain percentage is fifty percent.

4. The memory device of claim 1 further comprising a digital '0' bit detector.

5. The memory device of claim 1 further comprising an analog '0' bit detector.

6. The memory device of claim 5 wherein the analog '0' bit detector detects based upon a unit of current bias.

7. The memory device of claim 6 wherein said current bias is in microamperes.

8. A non-volatile memory device comprising:

an array comprising a plurality of sub-arrays of non-volatile memory cells;

an array of indicator memory cells associated with each sub-array of non-volatile memory cells;

a counter circuit for counting the number of memory cells of each unit to be programmed, the counter circuit comprising a digital bit detector, the bit detector configured to check the bits to be programmed in the unit;

a programming circuit for programming the inverse of the memory cells of the unit and the indicator memory cell associated with the unit using said programming current when an output of the counter circuit indicates a certain percentage or less of the memory cells of each unit is to be programmed, and for programming the memory cells of the unit when the output of the counter circuit indicates more than said certain percentage of the memory cells of each unit is to be programmed; and an output circuit comprising:

an indicator memory cell sense amplifier for sensing a value stored in the indicator memory cell;

a plurality of memory cell sense amplifiers for sensing values stored in one or more of the plurality of units of memory cells; and a multiplexor configured to receive as a first input an output of the plurality of memory cell sense amplifiers and to receive as a second input an inversion of the output of the plurality of memory cell sense amplifiers and to generate as an output the first input or second input based on an output of the indicator memory cell sense amplifier.

9. The memory device of claim 8 wherein data to be programmed contains more '0' than '1' data.

10. The memory device of claim 8 wherein each of said memory cells comprises:

a semiconductor substrate of a first conductivity type, having a planar surface;

a first region of a second conductivity type on the planar surface;

a second region of the second conductivity type on the planar surface, spaced apart from the first region, with a channel region therebetween;

a floating gate, spaced apart from a first portion of the channel region;

a word line, adjacent to the floating gate to one side thereof, insulated therefrom, and spaced apart from a second portion of the channel region;

an erase gate, adjacent to the floating to gate to another side thereof, insulated therefrom, and spaced apart from the second region; and a coupling gate over the floating gate, spaced apart therefrom, and between word line and the erase gate and insulated therefrom.

11. The memory device of claim 8 wherein said certain percentage is fifty percent.

* * * * *